United States Patent
Wasko

(10) Patent No.: US 11,522,201 B1
(45) Date of Patent: Dec. 6, 2022

(54) THERMAL ELECTRIC POWER GENERATION FROM THERMAL BATTERIES

(71) Applicant: The United States of America as represented by the Secretary of the Navy, Newport, RI (US)

(72) Inventor: Jarrod H Wasko, Newport, RI (US)

(73) Assignee: The United States of America as represented by the Secretary of the Navy

( * ) Notice: Subject to any disclaimer, the term of this patent is extended or adjusted under 35 U.S.C. 154(b) by 273 days.

(21) Appl. No.: 17/021,091

(22) Filed: Sep. 15, 2020

(51) Int. Cl.
  *H02J 7/00* (2006.01)
  *H01M 6/36* (2006.01)
  *H01L 35/32* (2006.01)

(52) U.S. Cl.
  CPC ............. *H01M 6/36* (2013.01); *H01L 35/32* (2013.01); *H02J 7/0013* (2013.01); *H02J 7/0063* (2013.01)

(58) Field of Classification Search
  USPC ................... 320/101, 102, 103, 104, 105
  See application file for complete search history.

(56) References Cited

U.S. PATENT DOCUMENTS

| | | | | |
|---|---|---|---|---|
| 2015/0083180 | A1* | 3/2015 | Lang | H01L 35/30 136/207 |
| 2019/0344670 | A1* | 11/2019 | Mattmuller | B60L 50/90 |
| 2019/0356030 | A1* | 11/2019 | Venkatasubramanian | H01L 23/38 |

* cited by examiner

*Primary Examiner* — Brian Ngo
(74) *Attorney, Agent, or Firm* — James M. Kasischke; Michael P. Stanley

(57) ABSTRACT

An electrical power generation system has a thermal battery and a thermoelectric module positioned proximate to the thermal battery. The thermoelectric module has a first side thermally coupled to the exterior of the housing; and an electrical circuit configured to conduct electrical current from the thermoelectric module to an electrical load. The electrical circuit can be configured to conduct electrical current from the thermal battery to the electrical load while the voltage produced by the thermal battery is above a threshold and to conduct electrical power from the thermoelectric module when the voltage produced by thermal battery drops below the threshold.

17 Claims, 5 Drawing Sheets

THERMAL ELECTRIC POWER GENERATION FROM THERMAL BATTERIES

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION (1) Field of the Invention

This application and the subject matter disclosed herein (collectively referred to as the "disclosure"), generally concern power generation devices, and related systems and methods. More particularly, but not exclusively, this disclosure pertains to systems, methods, and components to provide electric power from a heat source such as a thermal battery. As but one illustrative example, a thermoelectric array may be thermally coupled to a thermal battery and electrically coupled to a circuit that provides power to an electrical load. Such a system may extend the usefulness of a thermal battery, and may solve power requirement issues.

(2) Brief Description of the Prior Art

Thermal batteries, some examples of which sometimes also are referred to in the art as "molten salt" batteries, use an electrolyte that is solid and inactive at ambient temperatures. Some thermal batteries, for example, work through a chemical reaction of a lithium salt mixture. One example of a typical thermal battery has many cells in series that each have an anode, cathode, electrolyte, and igniter. The igniter sets off pyrotechnic reactions in each cell, which increases the temperature within the cell to the melting point of the electrolyte. The molten electrolyte is highly conductive, which allows current to flow between the anode and cathode of each cell.

Prior to activation, a thermal battery can remain inert and be stored for long periods of time, e.g., 20 years or more, yet provide full power virtually instantaneously when activated. Thermal batteries are also typically hermetically sealed so they can withstand environmental stresses, such as extreme temperatures (e.g., both high and low temperatures within a range of more than 100° C.), vibration, mechanical shock, vacuum, very high or low pressures, electro-magnetic interference, and acceleration. While inert, thermal batteries are non-explosive with respect to transportation, are safe for human operators to handle, and can be destroyed by conventional techniques.

Once activated, thermal batteries may provide high power for a relatively short time period (compared to other types of batteries), with output ranging from watts to kilowatts. A substantial amount of heat is generated when operating thermal batteries. Such batteries can attain a surface temperature of 400° F. or more when in operation. Discharge is either terminated by exhaustion of the cell materials or by solidification of the electrolyte upon cooling. However, thermal batteries continue to produce this heat even after their useful electrical life has ended.

Thermoelectric (TE) modules, also sometimes referred to in the art as "Seebeck generators" and "Peltier coolers," are solid state devices that convert heat flux, i.e., temperature differences, directly into electrical energy through a phenomenon known as the Seebeck effect. Conventionally, their high-power applications remain relatively limited, due to TE module inefficiencies. TE modules are available in standard and high-capacity forms. High-capacity TE modules have maximized heat flow capacity and generate more electrical power compared to standard TE modules of the same size.

SUMMARY OF THE INVENTION

The disclosed embodiments provide an assembly of one or more thermoelectric modules and a thermal battery that harnesses the persistent waste heat of the thermal battery to generate power. The power generated from the waste heat may be equivalent to that of the battery itself. Although conventional TE modules are generally inefficient, the amount of heat generated by standard thermal batteries is sufficient to overcome the general inefficiencies of the modules.

In some respects, concepts disclosed herein generally concern thermal electric power generation from thermal batteries. Some disclosed concepts pertain to systems, methods, and components to provide electric power from the waste heat of a thermal battery when the battery no longer produces power. As but one example, some disclosed assemblies of thermoelectric modules and thermal batteries are components of an electrical circuit that provides power to an electrical load from the thermal battery while the thermal battery is producing power and from the thermoelectric modules when the thermal battery no longer produces power.

In one aspect, an electrical power generation system can have a thermal battery comprising a housing defining an exterior; a high-capacity thermoelectric (TE) module having a first side thermally coupled to the exterior of the housing; and an electrical circuit configured to conduct electrical current from the TE module to an electrical load.

The electrical power generation system can have an array of a plurality of TE modules thermally coupled to the exterior of the housing and electrically connected to at least one other TE module in series, in parallel, or both.

The TE module can be planar and thermally coupled to the exterior of the housing by a thermally conductive fill material. The TE module can alternatively conform to a curvature of the housing.

The electrical circuit can be configured to conduct electrical current from the thermal battery to the electrical load while the voltage produced by the thermal battery is above a threshold voltage and to conduct electrical power from the TE module to the electrical load when the voltage produced by thermal battery drops below the threshold voltage. The electrical circuit can be configured to maintain an amount of current delivered to the electrical load within a selected range. A crossover point, at which the electrical current from the thermal battery is equal to the electrical current from the TE module, can be configurable.

The electrical power generation system can include a heat sink. A second side of the TE module is thermally coupled to the heat sink. This allows the TE module to operate between the first side coupled to the thermal battery and the second side coupled to the heat sink.

In another aspect, a device can have a power-consuming component; a thermal battery comprising a housing defining an exterior; and an array of high-capacity thermoelectric (TE) modules. Each respective TE module can be electrically connected to at least one other of the plurality of TE modules and can have a first side thermally coupled to the exterior of the housing. The device can have an electrical circuit configured to conduct electrical current from the TE module array to the power-consuming component.

The electrical circuit can be configured to conduct electrical current from the thermal battery to the power-consuming component while the voltage produced by the thermal battery is above a threshold and to conduct electrical power from the TE module when the voltage produced by thermal battery drops below the threshold.

The electrical circuit can be configured to maintain an amount of current delivered to the power-consuming component within a selected range.

A crossover point, at which the electrical current from the thermal battery is equal to the electrical current from the TE module, can be configurable.

The device can include a heat sink, to which a second side of each of the TE modules is thermally coupled.

Each of the plurality of TE modules can be planar. Alternatively, each of the plurality of TE modules can conform to a curvature of the housing.

Also disclosed are associated methods for delivering electrical power according to the disclosed embodiments.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION OF THE INVENTION

The following describes various principles related to thermal electric power generation from thermal batteries. For example, certain aspects of disclosed principles systems, methods, and components to provide electric power from the waste heat of a thermal battery when the battery no longer produces power. That said, descriptions herein of specific apparatus configurations and combinations of method acts are but particular examples of contemplated systems chosen as being convenient illustrative examples of disclosed principles. One or more of the disclosed principles can be incorporated in various other systems to achieve any of a variety of corresponding system characteristics.

Thus, systems having attributes that are different from those specific examples discussed herein can embody one or more presently disclosed principles, and can be used in applications not described herein in detail. Accordingly, such alternative embodiments also fall within the scope of this disclosure.

Conventionally, thermal batteries provide power and generate large amounts of waste heat when activated. Thermal batteries continue to generate large amounts of waste heat after their useful electrical life has ended. Thermoelectric (TE) modules convert thermal flux into electrical power, but are generally inefficient, especially at many ambient temperature gradients. Using TE modules to convert the large amounts of waste heat from thermal batteries to electrical power can extend the time that power is available from a thermal battery, thus extending the time available for a system using the power to function.

Accordingly, an approach to extend the useful life of thermal batteries with the use of thermoelectric modules has been developed. This approach could provide extended power solutions or added capabilities to systems that use thermal batteries, and even allow currently available thermal batteries to power future systems that may require levels of power not currently possible.

An array of high-capacity TE modules thermally coupled to a standard high-power thermal battery could produce the same amount of electrical power as the battery itself. In some applications, a thermal battery may be used until its initial voltage has dropped by some threshold amount, e.g., 5 to 10 Volts. However, the chemical reaction creating the heat in the battery continues, and the heat may be converted into electricity and provided to an electrical load for a period of time beyond the useful life of the thermal battery itself.

Figure 1:
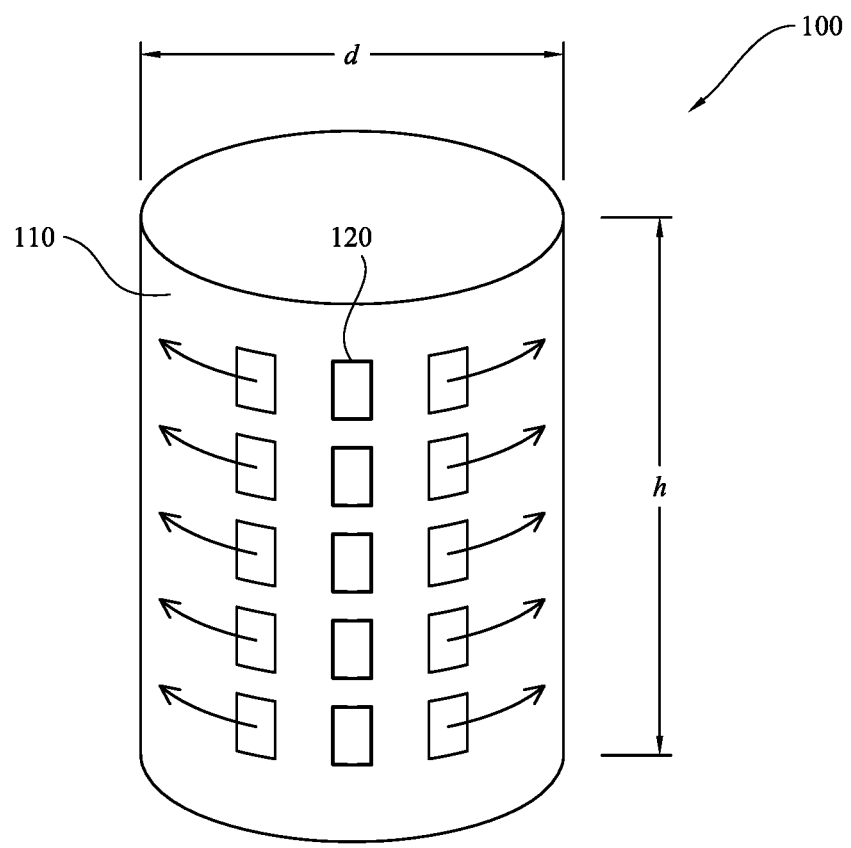
FIG. 1 illustrates an embodiment of an assembly of a thermal battery and an array of thermoelectric modules.

FIG. 1 illustrates an embodiment of an assembly of a thermal battery 100 and an array of one or more thermoelectric modules 120. The thermal battery 100 may be contained within a cylindrical housing 110 having a diameter d and a (longitudinal) height h. One or more thermal cells are within the housing. Thermal batteries are not limited to cylindrical housings, and may, for example, be housed in rectangular, ovoid, or other shaped housings.

In an embodiment, the one or more TE modules 120 may be thermally coupled to the exterior surface of the housing 110, e.g., to the circumferential surface, for example, with a thermally conductive adhesive, solder, putty, or paste. In another embodiment, the one or more TE modules may be in physical and thermal contact with the exterior of the exterior surface of the housing 110 without adhesion, and may be kept in place in a tensioned arrangement, for example, by circuitry connecting the TE modules to each other, and/or by an exterior housing or sleeve (not shown).

When a plurality of TE modules are used, they may be positioned around the entire circumferential surface or perimeter surface of the thermal battery, or around a portion of the circumferential surface. The TE modules may be positioned at multiple longitudinal positions on the thermal battery.

Many available TE modules are rectangular or square, and are generally planar, e.g., define opposed major surfaces having substantially larger ordinate dimensions (e.g., "length" and "width" dimensions) compared to an orthogonal (e.g., "thickness") dimension separating the opposed major surfaces. The length and/or width dimensions may range from, for example, about 1.5 mm to about 80 mm or more. As many thermal battery housings are cylindrical, a planar TE module may only be in physical contact with the housing along one line (or only a narrow surface) of the TE module where the plane of the TE module is tangent or substantially tangent to the curvature. However, it is not necessary for the entirety of the surface of the TE module to contact the battery housing directly, as long as heat can transfer, e.g., conduct, from the housing to the TE module. In order to obtain sufficient thermal contact between a planar TE module and a curved battery housing, smaller TE modules (relative to the dimensions of the battery housing) may be selected such that the surface area of the TE module that is not in direct contact with the housing is reduced. Alternatively, relatively larger TE modules with a conforming shape, e.g., curved TE modules that are configured to make contact with a curved thermal battery housing, may be used. As yet another example, a thermally conductive fill material can be disposed between a curved surface of the thermal battery and a flat surface of the TE device.

Figure 2:
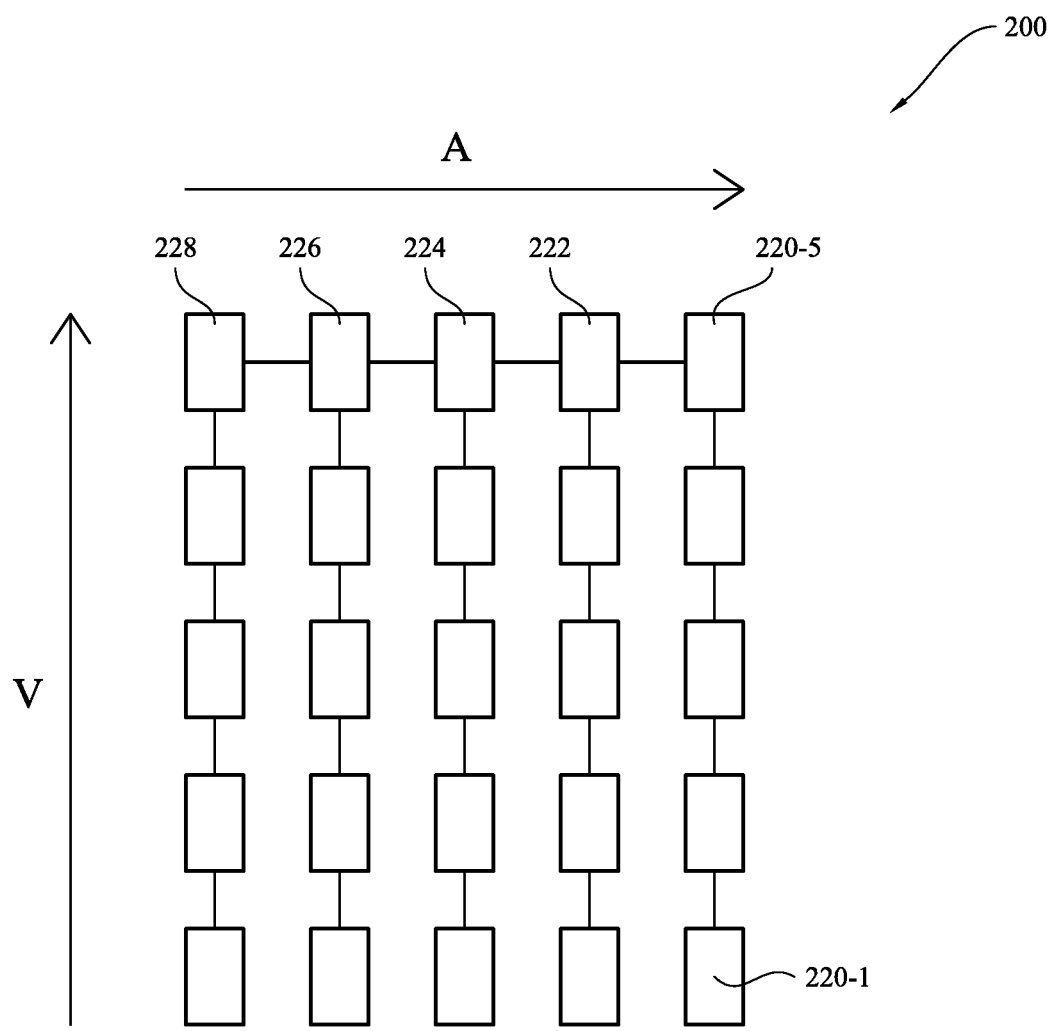
FIG. 2 illustrates an embodiment of an array of thermoelectric modules.

FIG. 2 illustrates an embodiment of an array 200 of thermoelectric modules. In an array, TE modules may be electrically connected to one or more other TE modules in series, in parallel, or both, in a manner analogous to connecting batteries in series and/or in parallel. When TE modules are connected in series, their voltages are added together. When TE modules are connected in parallel, the ampere-hours of the TE modules are added together. By combining both of these properties in a series/parallel array of modules, the total power output is greater than a single module. For example, adding the modules 220-1 through 220-5 in series produces five times the voltage of one TE module. If the power of one module is 5 Volts (V)×1 Amp (A)=5 Watts, then the voltage from the series of five TE modules is 25V and the power is 25V×1 A=25 W. The current produced by the parallel TE modules 220-5, 222, 224, 226, and 228 adds together. If the current from one TE module is 1 A, then the current produced by the parallel TE modules 220-5, 222, 224, 226, and 228 is 5×1 A=5 A. If the TE modules in the 5×5 array 200 are connected both in series and in parallel, the total power output of the array of modules is 25 Watts.

Suppose, for example, a TE module with dimensions of 0.25"×0.50" and a cylindrical high-power thermal battery with a diameter of 2.75" and a height of 4.45". Approximately 300 modules (or a lower number of larger, conformal modules) could be fitted to the battery surface. Connected in a series/parallel arrangement, the array of modules could together produce 100 Watts of power. This would be enough to power a device requiring 25 Volts at 4 Amps.

Figure 3:
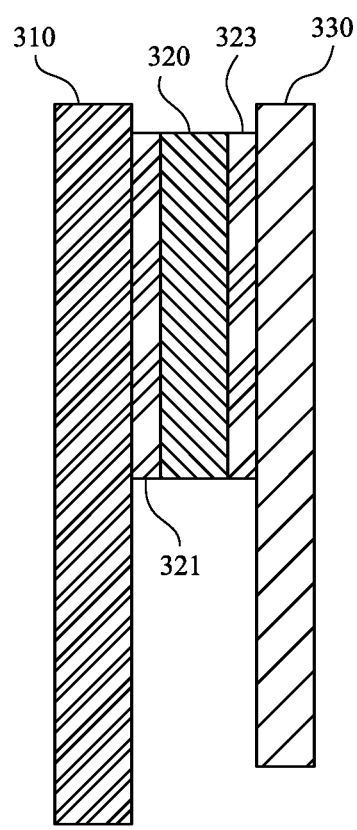
FIG. 3 illustrates an embodiment of thermal couplings among a thermal battery, a thermoelectric module, and a heat sink.

FIG. 3 illustrates a cross-sectional view of the thermal couplings among a thermal battery, a thermoelectric module, and a heat sink. The dimensions illustrated in FIG. 3 are not to scale, and are exaggerated for clarity. The battery housing 310 is thermally connected to the "hot side" 321 of a TE module 320. When activated, the battery housing 310 may reach or exceed a temperature of 400° F.

The "cool side" 323 of the TE module 320 may be thermally connected to a heat sink 330. The heat sink 330 is used to maintain the temperature differential from the hot side 321 to the cool side 323 to improve the power output of the TE modules. Most prior applications of TE power generation result in low power levels because of the small temperature differences found in conventional environments. With the use of a heat sink 330, a temperature difference ($\Delta T$) on the order of 400° F. may be achieved.

A temperature difference of that magnitude may allow a high-capacity TE module that normally produces, for example, 0.5 Watts, to produce over 6 Watts of power, an order of magnitude increase. Affixing multiple TE modules in an electrical array to as much of the surface area of the battery housing as possible may produce a level of power approaching that produced by the battery itself.

The heat sink 330 may be, for example, a container conforming to the shape of the thermal battery and TE module array assembly, e.g., a cylindrical tube that is thermally in contact with the cool sides of all of the TE modules in the assembly. The other side of the heat sink may be in thermal contact with a coolant such as chilled air, chilled water, or a fluid that is cooler than the exterior housing 310 of the thermal battery.

Examples of circuitry that switches a load current from a thermal battery to an array of TE modules are described below. It should be noted that there are many different embodiments for this type of circuit, and these are but two examples.

Figure 4:
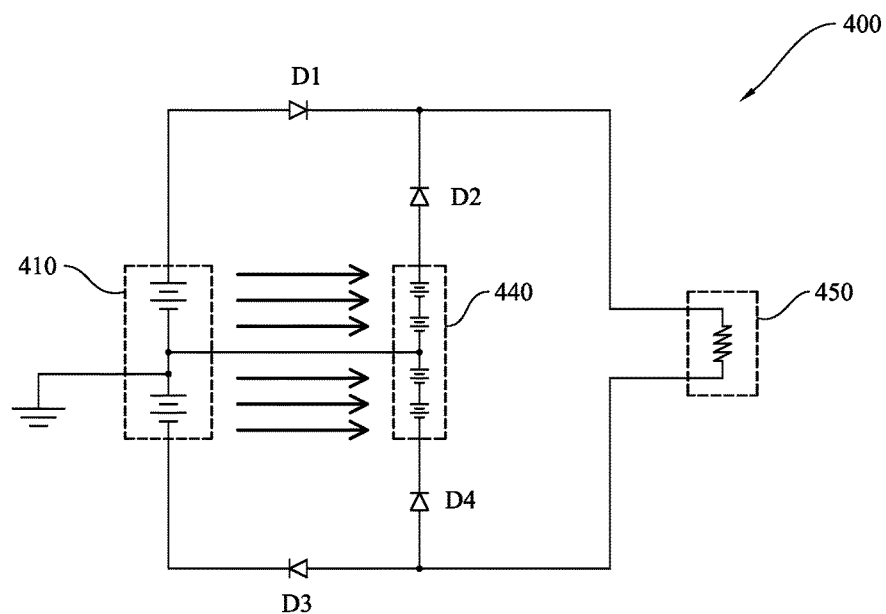
FIG. 4 is a circuit diagram that includes a thermal battery and an array of thermoelectric modules.

FIG. 4 is a diagram for a voltage-sensing and current-balancing circuit 400. The circuit 400 includes a thermal battery 410 having at least one thermal cell, an array 440 of TE modules, and an electrical load 450. The array 440 is in thermal contact with the thermal battery 410 and heat transfers from the battery 410 to the array 440 as indicated by the horizontal arrows. The diodes D1, D2, D3, and D4 provide a diode OR circuit.

Figure 5:
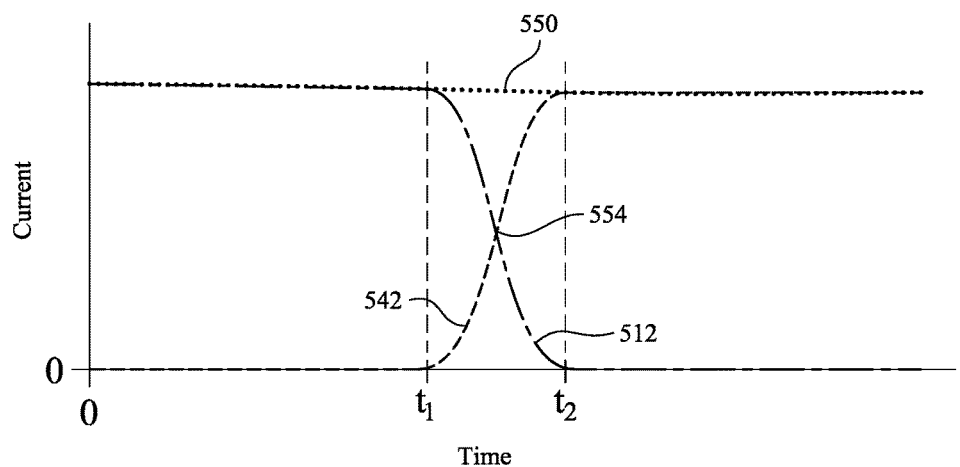
FIG. 5 illustrates an example of current output for the circuit diagram in FIG. 4.

FIG. 5 is a graph of the current received at the electrical load 450 for the circuit 400 in FIG. 4. From time 0 to time $t_1$, the electrical load 450 receives current from the thermal battery, shown by line 512. At time $t_1$, the voltage of the thermal battery drops below a predetermined threshold and the output of the thermal battery begins to decline. At the same time, the TE array 440 begins to provide current, as shown by line 542. By time $t_2$, the current from the thermal battery is essentially 0, and the TE array 540 supplies all of the current received by the electrical load. The total current provided to the electrical load over time is represented by line 550 and remains substantially constant even as the current from the thermal battery subsides and the current from the TE array 440 increases. The crossover point 554 where the current supplied by the thermal battery is equal to the current supplied by the TE array occurs approximately halfway between $t_1$ and $t_2$.

Figure 6:
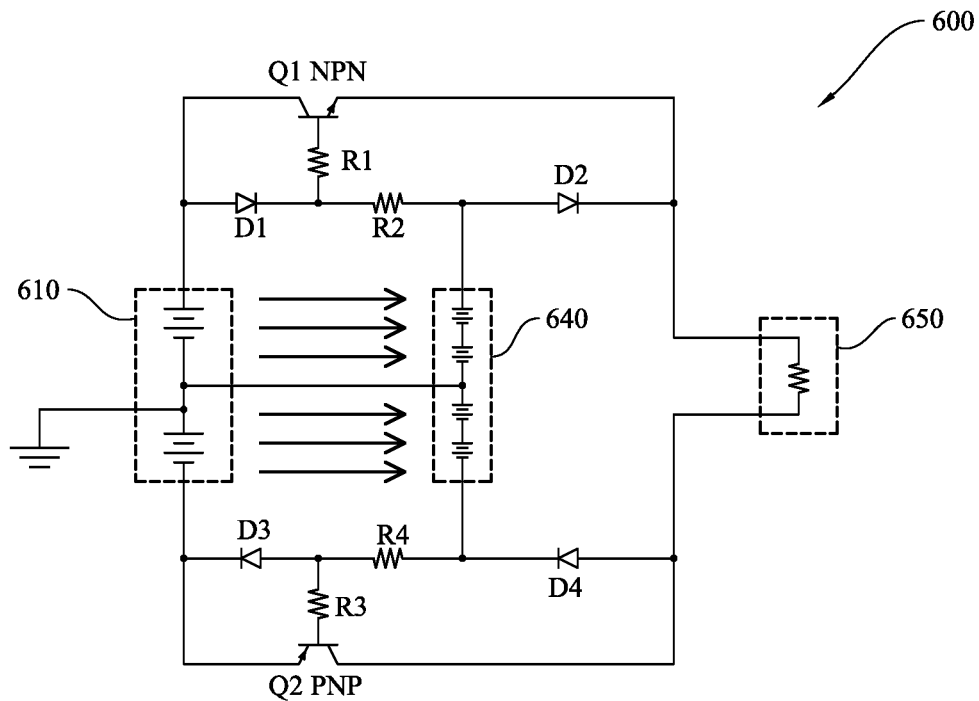
FIG. 6 is a second circuit diagram that includes a thermal battery and an array of thermoelectric modules.

FIG. 6 is a diagram for a second voltage-sensing and current-balancing circuit 600. The circuit 600 includes a thermal battery 610 having at least one thermal cell, a TE array 640 and an electrical load 650. The circuit 600 includes an NPN transistor Q1, a PNP transistor Q2, and resistors R1, R2, R3, and R4. The voltage threshold at which the current crossover point occurs may be selected according to the biasing voltages selected for the transistors, e.g., according to the resistances selected for R1 and R3.

Figure 7:
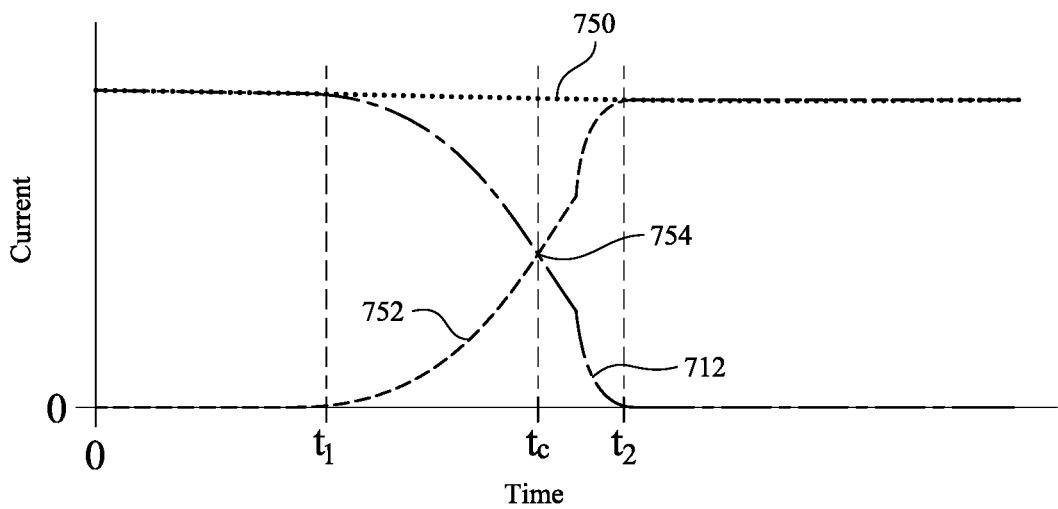
FIG. 7 illustrates an example of current output for the circuit diagram in FIG. 6.

FIG. 7 is a graph of the current received by the electrical load 650 for the circuit 600 in FIG. 6. From time 0 to time $t_1$, the electrical load 650 receives current from the thermal battery, shown by line 712. At time $t_1$, the voltage of the thermal battery drops below a threshold and the output of the thermal battery begins to decline. At the same time, the TE array 640 begins to provide current, as shown by line 742. By time $t_2$, the current from the thermal battery is essentially 0, and the TE array 640 supplies all of the current received by the electrical load 650. The total current provided to the electrical load over time is represented by line 750 and remains substantially constant even as the current from the thermal battery subsides and the current from the TE array 640 increases. The crossover point 754 of the two currents occurs between $t_1$ and $t_2$, at a time $t_c$. Time $t_c$ occurs after $t_1$ and before $t_2$ but may occur later than, or earlier than, the halfway point between $t_1$ and $t_2$.

The following example illustrates an amount of power that may be provided by an exemplary system according to the above embodiments.

Suppose a temperature at the hot side of a TE module of $T_h$=410° F. (483K); and temperature at the cold side of $T_c$=85° F. (303K), with an average temperature of $T_{av}$=393K, and a temperature difference of $\Delta T$=180K. At an average temperature of 393K, an exemplary TE module may produce power according to the following equation:

$$(0.05325 \times \Delta T)^2/(4 \times 3.5354) = (0.05325 \times 180)^2/(4 \times 3.5354) = 6.5 \text{ Watts}$$

If an array of sixteen of such TE modules are attached to a standard thermal battery, the power produced would be (6.5 W)×(16)=104 Watts.

The examples described above generally concern apparatus, methods, and related systems to supply electrical power from waste heat of thermal batteries. More particularly, but not exclusively, disclosed principles pertain to systems, methods, and components to extend the useful life of a thermal battery with the use of TE modules and electrical circuitry to balance the current delivered from a thermal battery and an array of TE modules.

Nonetheless, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, other electrical circuits may be used to provide current to one or more electrical loads from one or more assemblies of thermal batteries and TE modules.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

Those of ordinary skill in the art will further appreciate that the exemplary embodiments disclosed herein can be adapted to various configurations and/or uses without departing from the disclosed principles. Applying the principles disclosed herein, it is possible to provide a wide variety of arrangements to provide thermal electric power from thermal batteries. For example, certain aspects of disclosed principles systems, methods, and components provide electric power from the waste heat of a thermal battery when the battery no longer produces electric power. The principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of configurations to provide thermal electric power generation from thermal batteries, and related methods and systems that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

What is claimed is:

1. An electrical power generation system for powering an electrical load comprising:
    a thermal battery having at least one thermal cell and a housing defining an exterior;
    a thermoelectric module having a first side thermally coupled to the exterior of the thermal battery housing, and a second side distal from the thermal battery housing; and
    an electrical circuit joined to the thermoelectric module and to the electrical load to conduct electrical current from the thermoelectric module to the electrical load, wherein the electrical circuit is electrically joined to the thermal battery and configured to conduct electrical power from the thermal battery to the electrical load while the voltage produced by the thermal battery is above a threshold voltage and to conduct electrical power from the thermoelectric module to the electrical load when the voltage produced by thermal battery drops below the threshold voltage.

2. The electrical power generation system of claim 1, further comprising an array of thermoelectric modules thermally coupled to the exterior of the thermal battery housing, each thermoelectric module being electrically connected to at least one other thermoelectric module in a selected one of a series circuit, a parallel circuit, and a combination of series and parallel circuits.

3. The electrical power generation system of claim 1, wherein the thermoelectric module is planar and thermally coupled to the exterior of the thermal battery housing by a thermally conductive fill material.

4. The electrical power generation system of claim 1, wherein the thermoelectric module conforms to a curvature of the thermal battery housing.

5. The electrical power generation system of claim 1, wherein the electrical circuit is configured to maintain an amount of current delivered to the electrical load within a selected range.

6. The electrical power generation system of claim 1, wherein the electrical circuit is configured to increase electrical current from the thermoelectric module as electrical current from the thermal battery decreases to maintain an electrical current level, and wherein the electrical current level is configurable.

7. The electrical power generation system of claim 1, further comprising a heat sink thermally coupled to the second side of the thermoelectric module.

8. A device comprising:
 a power-consuming component;
 a thermal battery having a housing defining an exterior;
 an array of thermoelectric modules, each respective module electrically connected to at least one other of the plurality of thermoelectric modules and having a first side thermally coupled to the exterior of the thermal battery housing and a second side opposite the first side; and
 an electrical circuit electrically joined to the thermoelectric module array and to the power-consuming component to conduct electrical current from the thermoelectric module array to the power-consuming component, wherein the electrical circuit electrically connected to the thermal battery to conduct electrical current from the thermal battery to the power-consuming component while the voltage produced by the thermal battery is above a threshold voltage and to conduct electrical current from the thermoelectric module when the voltage produced by thermal battery drops below the threshold voltage.

9. The device of claim 8, wherein the electrical circuit is configured to maintain an amount of electrical current delivered to the power-consuming component within a selected range of electrical current values.

10. The device of claim 8, wherein the amount of electrical current from the thermal battery and the amount of electrical current from the thermoelectric module is configurable.

11. The device of claim 8, further comprising a heat sink joined to the second side of each of the thermoelectric modules.

12. The device of claim 8, wherein each of the plurality of thermoelectric modules is planar.

13. The device of claim 8, wherein each of the plurality of thermoelectric modules conforms to a curvature of the housing.

14. A method of delivering power to an electrical load comprising:
 thermally coupling a first side of a thermoelectric module to an exterior of a thermal battery housing;
 thermally coupling a second side of the thermoelectric module to a heat sink;
 electrically connecting the thermoelectric module, the thermal battery, and the electrical load to an electrical circuit configured to conduct electrical current from the thermoelectric module to the electrical load and from the thermal battery to the electrical load;
 establishing a threshold voltage;
 conducting electrical current from the thermal battery to the electrical load while the voltage produced by the thermal battery is above the threshold voltage; and
 conducting electrical power from the thermoelectric module to the electrical load when the voltage produced by thermal battery drops below the threshold voltage.

15. The method of claim 14, further comprising:
 thermally coupling an array of a plurality of thermoelectric modules to the exterior of the thermal battery housing;
 electrically connecting each of the thermoelectric modules to at least one other adjacent thermoelectric module; and
 connecting the array of thermoelectric modules to the electrical circuit.

16. The method of claim 14, comprising:
 conducting electrical current from both the thermal battery and the thermoelectric module to the electrical load when the voltage produced by the thermal battery drops below the threshold voltage.

17. The method of claim 16, comprising maintaining an amount of current delivered to the electrical load within a selected range.

\* \* \* \* \*